(12) United States Patent
Nabemoto et al.

(10) Patent No.: US 6,625,880 B2
(45) Date of Patent: Sep. 30, 2003

(54) METHOD FOR PRODUCING PRINTED WIRING BOARD

(75) Inventors: Yoshie Nabemoto, Ishikawa (JP); Nobuo Komatsu, Tokyo (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 09/796,705

(22) Filed: Mar. 2, 2001

(65) Prior Publication Data

US 2001/0027605 A1 Oct. 11, 2001

(30) Foreign Application Priority Data

Mar. 3, 2000 (JP) ................................. P2000-063363

(51) Int. Cl.[7] .............................................. H05K 3/36
(52) U.S. Cl. ........................... 29/830; 29/837; 29/841; 29/846; 228/180.21; 264/272.11
(58) Field of Search ................. 29/830, 831, 832, 29/837, 840, 841, 846, 852; 156/64, 228; 228/103, 104, 165, 205, 206, 180.1, 180.21, 180.22; 174/261, 256, 255; 257/700, 723, 724; 427/96, 355; 264/272.11, 272.15, 272.18

(56) References Cited

U.S. PATENT DOCUMENTS

| | | | | |
|---|---|---|---|---|
| 4,812,949 A | * | 3/1989 | Fontan et al. ............... 257/668 |
| 5,081,562 A | * | 1/1992 | Adachi et al. ............... 174/255 |
| 5,081,563 A | * | 1/1992 | Feng et al. .................. 174/260 |
| 5,306,670 A | * | 4/1994 | Mowatt et al. ................ 29/832 |
| 5,590,461 A | * | 1/1997 | Ishida ......................... 174/255 |
| 5,597,643 A | * | 1/1997 | Weber ......................... 174/255 |
| 5,659,953 A | * | 8/1997 | Crane et al. ............ 228/180.22 |

* cited by examiner

Primary Examiner—A. Dexter Tugbang
Assistant Examiner—Donghai Nguyen
(74) Attorney, Agent, or Firm—Ronald P. Kananen, Esq.; Rader, Fishman & Grauer PLLC

(57) ABSTRACT

A multi-layer printed wiring board is manufactured by forming a wiring pattern and a component mounting portion on a first substrate. An insulating spacer, formed with a first opening, is stacked over the first substrate with the first opening in registration with the component mounting portion. A second substrate is stacked over the spacer and the resulting assembly is bonded together. A second opening, continuing to the first opening, is formed in the second substrate, exposing the component mounting portion to the outside. An LSI is mounted on the component mounting portion, the first and second openings are filled with a synthetic resin mass, and then a third substrate is stacked over the second substrate to enclose the openings.

9 Claims, 7 Drawing Sheets

METHOD FOR PRODUCING PRINTED WIRING BOARD

BACKGROUND OF THE INVENTION

1. Field of the Invention

This invention relates to a method for producing a printed wiring board having electronic components, such as LSI (large-scale integrated circuit), enclosed therein.

2. Description of Related Art

Heretofore, a printed wiring board unit, arranged in a casing forming an electronic equipment, has a pre-set wiring pattern formed on its one or both sides, and electronic components, such as LSIs, mounted on a land to form a number of variable electrical circuits. In a certain printed wiring board, used in a miniaturized multi-functional electronic equipment, plural substrates, each carrying a wiring pattern, are layered together, and electronic components are mounted on both sides of the layered structure.

Meanwhile, in a certain printed wiring board, plural substrates are layered together, and electronic components are embedded in the interior, in order to mount a larger number of electronic components on the substrate. The printed wiring board, having electrical components embedded therein, are formed as shown for example in FIGS. 1 to 4. That is, a first wiring pattern 52 is formed on one surface of a first substrate 51, as shown in FIG. 1. On the other surface of the first substrate 51 is formed an electrically conductive layer 53, formed by a copper foil, in order to form a fourth wiring pattern. A via-hole 60 is formed in the first substrate 51 for establishing electrical connection between the first wiring pattern 52 and the fourth wiring pattern as later explained. The via-hole 60 is plated with copper as at 60a. On one surface of the first substrate 51, carrying the first wiring pattern 52, there is provided a spacer 54 for achieving insulation from a second substrate 55 layered on the first substrate 51. On at least one surface of the second substrate 55 is formed a second wiring pattern 56.

The first substrate 51, on which is formed the first wiring pattern 52, and the second substrate 55, on which is formed the second wiring pattern 56, are formed separately from each other. The second substrate 55 is stacked on the spacer 54 and bonded thereto by hot pressing. A via-hole 65 then is formed for electrically connecting the electrically conductive layer 53 of the first substrate 51 and the second wiring pattern 56 of the second substrate 55 and the inside of the via-hole is plated wan copper at 66.

For exposing an area on the first substrate 51 on which to mount an electronic component 57 to outside, an opening 58 is formed by a router 59 in the second substrate 55 and in the spacer 54. Specifically, the router 59 is run along an approximately rectangular path to cut the outer rim of the opening 58, and subsequently the router is run along a staggered path in the interior of the rectangle to form the opening 58 extending through the thicknesses of the substrate 55 and the spacer 54. So, a component mounting portion 61 of the electronic component 57, placed on one surface of the first substrate 51, is exposed to outside via the opening 58 formed in both the substrate 55 and in the spacer 54. On this component mounting portion 61, exposed to outside via the opening 58, the electronic component 57, such as LSI, is mounted and soldered in position. The opening, in which the electronic component 57 has been mounted as described above, a synthetic resin mass 67 is charged by potting.

On the second substrate 55, a third substrate 62 is formed by RCC (resin coated copper foil) molding, as shown in FIG. 4. Specifically, the third substrate 62 is formed on the second substrate 55 by press fitting a resin-coated copper foil under vacuum heating. An electrically conductive layer of a copper foil, formed on the third substrate 62, is etched to form a third wiring pattern 63. An electrically conductive layer, provided on the opposite surface of the first substrate 51, is also etched to form a fourth wiring pattern 64. A via-hole 68 then is formed in the third substrate 62 in order to provide for electrical connection between the third wiring pattern 63 provided on the third substrate 62 and the second wiring pattern 56 provided on the second substrate 55. The printed wiring board, prepared as described above, then is checked electrically whether or not the wiring pattern is short-circuited. This electrical check is conducted because the fourth wiring pattern 64 is not formed in the previous step, with the electrical circuit of the printed wiring board being in a short-circuited state.

In the method for producing the printed wiring board, as described above, the opening 58 is formed by the router 59 for mounting the electrical component 57 on the component mounting portion 61 of the first substrate after layering the spacer 54 and the second substrate 55 on the first substrate 51. However, a drill of the router 59 has a tolerance in the vertical direction on the order of ±30 μm, so that, if the drill intruding depth is too shallow, the first wiring pattern 52 is not exposed, whereas, if the drill intruding depth is too deep, the first wiring pattern 52 also is cut. So, a thin copper foil cannot be used as the first wiring pattern 52 so that a thin pattern is difficult to form. In addition, the component mounting portion 61 cannot be worked to high planarity.

In the above-described process, the electrical component 57 is mounted on the component mounting portion 61 of the first substrate 51, the third substrate 62 is mounted on the second substrate 55 and finally the printed wiring board is checked electrically. So, if this electrical check has revealed that the printed wiring board is short-circuiting, not only the first to third substrates 51, 55, 62, but also the electrical component 57 are wasted.

SUMMARY OF THE INVENTION

It is therefore an object of the present invention to provide a manufacturing method for a printed wiring board whereby a printed wiring board having electronic components enclosed therein can be manufactured easily and efficiently.

According to the present invention, there is provided a method for producing a printed wiring board including the steps of forming a wiring pattern on one surface of a first substrate and forming a component mounting portion for mounting an electronic component thereon, forming an insulating spacer having a first opening formed in registration with the component mounting portion of the first substrate, forming a second substrate, stacking the spacer on the one surface of the first substrate, with the first opening in registration with the component mounting portion, stacking the second substrate on the spacer, pressing together the first substrate, spacer and the second substrate, thus stacked, for bonding the first and second substrates together, boring a second opening in the second substrate, after bonding the first substrate, spacer and the second substrate together, in registration with the first opening, so that the second opening is in continuation to the first opening, for exposing the component mounting portion of the first substrate to outside, mounting an electronic component on the component mounting portion of the first substrate which makes up the bottom of a spacing delimited by the first and second openings, continuing to each other, and filling resin in the spacing, having the electronic component mounted therein, and providing a third substrate on the second substrate to stop the spacing after charing resin in the spacing.

Since the spacing is provided by the spacer provided with the first opening, the second opening may be formed by a router in the second substrate without damaging the component mounting portion of the first substrate.

By forming the spacer by the core material, the first prepreg provided between the core material and the first substrate and the second prepreg provided between the core material 26 and the second substrate, the resin component, such as epoxy resin, is prevented from seeping out around the first and second substrates.

In the step of forming the second substrate, the through-hole is bored in the second substrate at a position overlying the first opening, so that, when the first and second substrates are unified together via the spacer, the spacing delimited by the first and second substrates and the first opening of the spacer may be prevented from becoming a hermetically sealed spacing, that is a spacing maintained in vacuum, thereby preventing the first or second substrate from becoming deformed.

After the first substrate, spacer and the second substrate are bonded together, a further wiring pattern is formed on the other surface of the first substrate 11. At this stage, the substrate is checked electrically. Since the substrate can be checked electrically before mounting the electronic component, wastage of the electronic components may be eliminated even if the substrate is found to be short-circuited.

When pressing the first and second substrates, these first and second substrates, stacked together, are heated under pressure at a temperature lower than the temperature allowed for these component units, to prevent thermal deformation of the component units.

It is noted that, in providing the third substrate on the second substrate, the first substrate, spacer and the second substrate, bonded together, are grounded to prevent the electronic components from being damaged by static charges.

With the manufacturing method for the printed wiring board according to the present invention, in which the spacing is provided by the spacer having the first opening, the second opening may be formed by the router in the second substrate without damaging the component mounting portion of the first substrate. Since it is sufficient to run the router to follow the outer rim of the first opening, the processing time can be shorter than in the conventional method.

DESCRIPTION OF THE PREFERRED EMBODIMENTS

Figure 1:
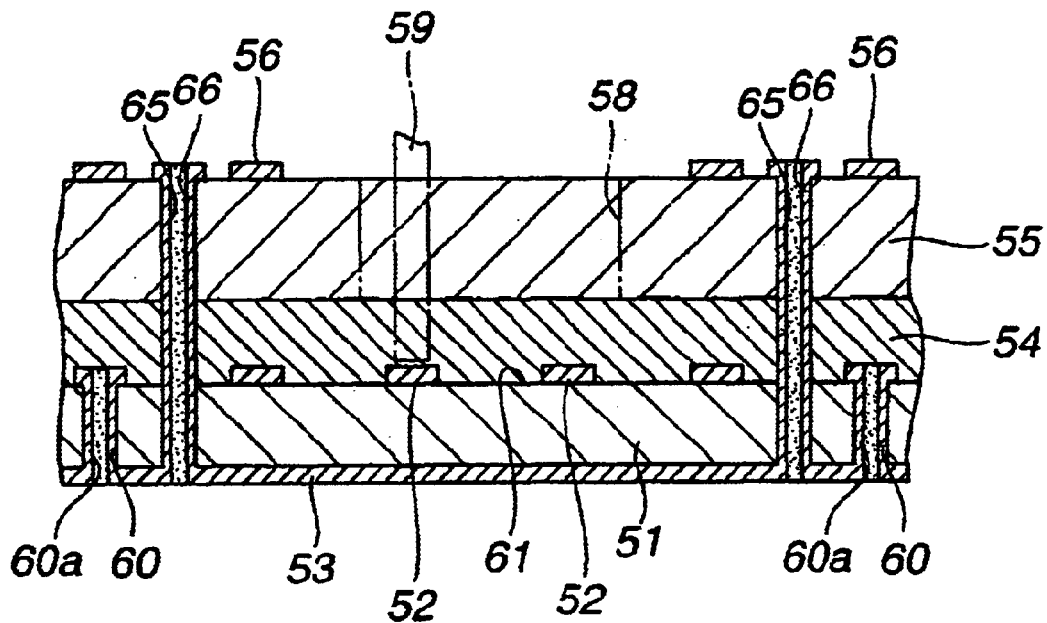
FIG. 1 is a cross-sectional view showing the state in which a spacer and a second substrate have been stacked on the first substrate forming the printed wiring board obtained by a conventional manufacturing method.

Referring to the drawings, a manufacturing method for a printed wiring board having an enclosed electronic component according to the present invention will be explained in detail.

The manufacturing method for the printed wiring board is now explained. Referring first to FIGS. 5 to 9, a first substrate 11, a second substrate 19, provided on the first substrate, and a spacer 25, provided between a first substrate 11 and the second substrate 19, are prepared separately. The spacer 25 is stacked over the first substrate 11 and the second substrate 19 is stacked over the spacer 25. The resulting assembly is unified together by press working.

Figure 5:
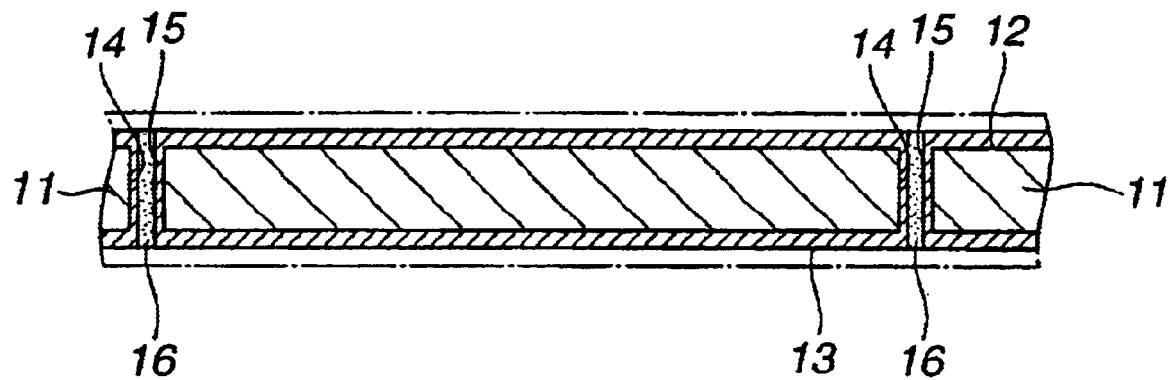
FIG. 5 is a cross-sectional view showing a first substrate forming a printed wiring board produced by the manufacturing method according to the present invention.

Turning now to the first substrate 11, a copper foil approximately 12 μm is bonded to each surface of a core material, 0.4 mm in thickness, so that a first electrically conductive layer 12 and a second electrically conductive layer 13 are formed on one and the other surface of the core material, as shown in FIG. 5. The first electrically conductive layer 12 and the second electrically conductive layer 13 are each soft-etched to a thickness of approximately 7 μm to reduce the thickness of a wiring pattern. In the first substrate 11, now carrying the first electrically conductive layer 12 and the second electrically conductive layer 13, each being of a reduced thickness, a via-hole 14 is bored to provide for electrical connection across the first electrically conductive layer 12 and the second electrically conductive layer 13. For forming this via-hole 14, a drill unit with a drill diameter of 0.2 mm is used. The first substrate 11, now provided with the via-hole 14, is copper-plated at 15, to a mean plating thickness of 24 mm, on its entire surface, inclusive of the inner peripheral surface of the via-hole 14, to provide for electrical connection between the first electrically conductive layer 12 and the second electrically conductive layer 13. The via-hole, the inner peripheral surface of which is plated with copper as at 15, is filled with a synthetic resin mass 16 by way of permanent filling.

Figure 6:
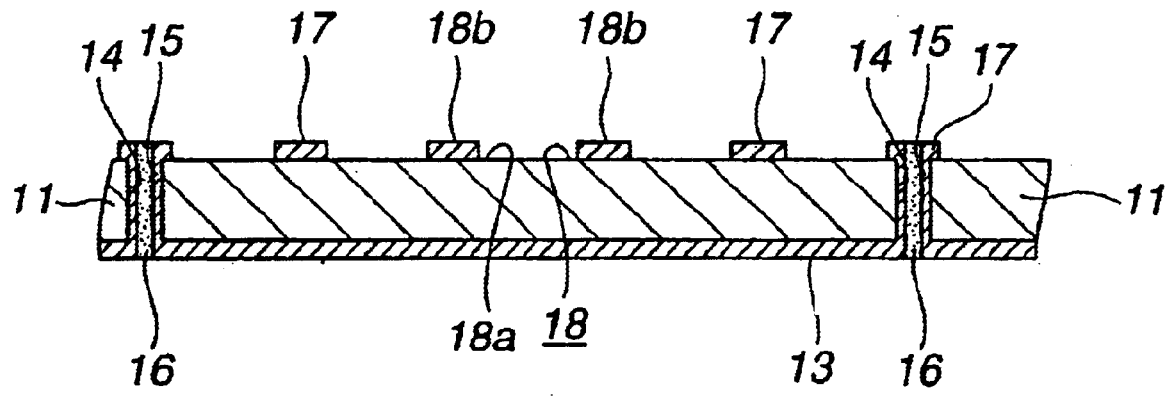
FIG. 6 is a cross-sectional view showing the state in which the first wiring pattern has been formed on the first substrate.

On the surface of the first electrically conductive layer 12 on one surface of the first substrate 11 is bonded a dry film, as shown in FIG. 6, and a first wiring pattern 17 is formed by light exposure and development. On the first substrate 11 is formed a component mounting portion 18 for mounting an electronic component, such as an LSI (large-scale integrated circuit). This component mounting portion 18 is made up of a mounting portion 18a, not provided with the first wiring pattern 17 used for bonding an electronic component to the first substrate 11, such as with an adhesive, and a land portion 18b, used for soldering a lead wire forming a part of the electronic component. The surface of the first wiring pattern 17 then is blacked for roughing, using a treatment solution for improving adhesion to the spacer 25 stacked thereon.

Figure 7:
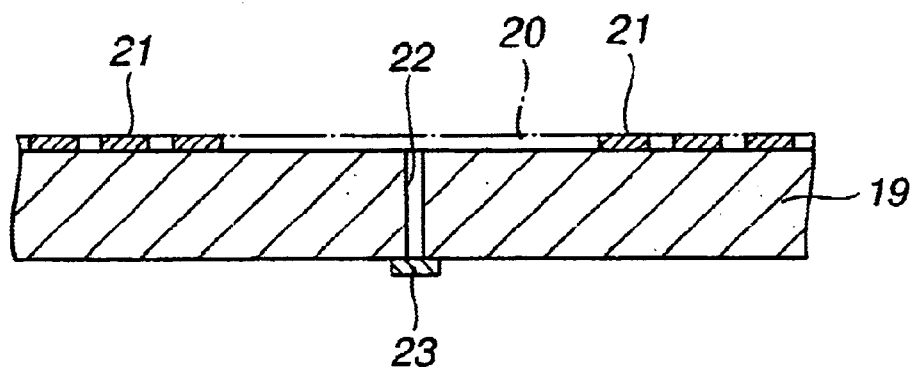
FIG. 7 is a cross-sectional view showing a second substrate provided on the first substrate.
Figure 8:
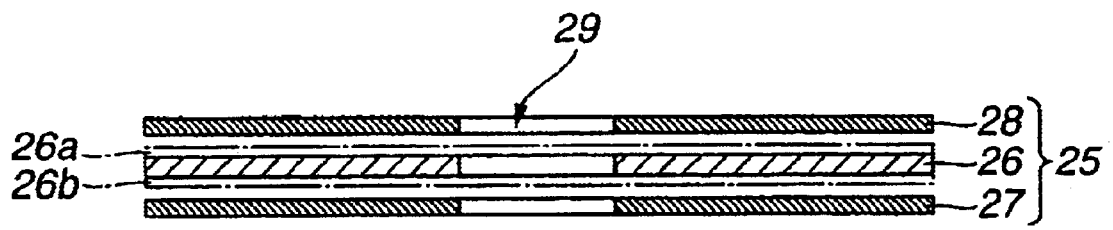
FIG. 8 is a cross-sectional view showing the decomposed state of a spacer provided between the first and second substrates.

Referring to FIG. 7, showing the second substrate 19 provided on the first substrate 11, a copper foil approximately 18 μm in thickness is bonded on at least one surface of the core material, about 0.4 mm in thickness, to form a third electrically conductive layer 20. A dry film then is bonded to the surface of the third electrically conductive layer 20 of the second substrate 19, exposed to light, developed and etched to form a second wiring pattern 21. Of course, a further wiring pattern may also be formed on the opposite side surface of the second substrate 19.

In register with the center of the first opening used for mounting the electronic component provided in a spacer 25 of the second substrate 19 as later explained is formed a through-hole 22. This through-hole is bored to a diameter of 0.3 mm, using a drill mill. The second wiring pattern 21 then is blacked for roughing, using a treatment solution, for improving adhesion to a third substrate stacked thereon. The through-hole 22 then is stopped by bonding a tape piece 23 on the opposite side surface of the second substrate 19 towards the spacer 25. This tape piece 23 prohibits the intrusion into the substrate of a developing solution or an etching solution in forming the wiring pattern during the subsequent step. So, the tape piece 23 used is such a one which is permeating to gas but not permeating to water, for example, "goatex" coated with an adhesive.

This through-hole 22 is formed to a diameter of 0.1 to 1.0 mm. If the diameter of the through-hole is less than 0.1 mm, the through-hole is difficult to bore, whereas, if the diameter is larger than 1.0 mm, the operation of stopping the through-hole 22 with the tape piece 23 is labor-consuming.

The spacer 25 is made up of a core material 26, a first prepreg 27 and a second prepreg 28, arranged on one and the other surface of the core material 26. On both surfaces of the core material 26, approximately 0.2 mm in thickness, there are bonded copper foils 26a, 26b, each being 12 μm in thickness. The first and second prepegs 27, 28 are each a sheet material, approximately 0.1 mm in thickness, obtained on inpregnating glass fibers with e.g., a thermosetting resin, such as epoxy resin. The first and second prepregs 27, 28 operate as an adhesive layer between the first substrate 11 and the core material 26 and as an adhesive layer between the second substrate 19 and the core material 26, respectively. As for the spacer 25, the first and second prepregs 27, 28 are superposed on both sides of the core material 26, and a first opening 29 for placing the electronic component on the first substrate 11 is formed to a substantially rectangular profile in register with the component mounting portion 18 of the first substrate 11. This first opening 29 is formed using a drill with a diameter of 0.2 mm. The core material 26 and the first and second prepregs 27, 28 are separated from one another and the copper foils on both sides of the core material 26 are etched off.

As for the first substrate 11, second substrate 19 and the spacer 25, formed as described above, the spacer 25, obtained on layering the first prepreg 27, core material 26 and the second prepreg 28 in this order, is superposed on one surface of the first substrate 11 carrying the first wiring pattern 17, and the second substrate 19 is stacked on the so-produced spacer 25, that is on the second prepreg 28, so that the second wiring pattern 21 will face upwards. The resulting assembly then is caulked together. The first substrate 11, spacer 25 and the second substrate 19, superposed one on others, are loaded on a hot press device and thermally pressed under a condition of 110° C., 60 minutes and 20 kg/cm². The resulting product then is baked under a condition of 180° C. and 60 minutes for curing the first and second prepregs 27, 28. So, the first prepreg 27 bonds the first substrate 11 and the core material 26 together, whilst the second prepreg 28 bonds the core material 26 and the second substrate 19 together, such that the first substrate 11 and the second substrate 19 are unified to each other through the spacer 25.

Meanwhile, the heating temperature for hot press working is not higher than the glass transition temperature, as an allowed temperature, such as 180° C., in order to prevent thermal deformation of the first substrate 11 and the second substrate 19. In heating the first substrate 11 and the second substrate 19 under pressure, the spacer 25, comprised of the core material 26, as a fixed layer, interposed between the first and second prepregs 27, 28, prevents resin components, such as epoxy resins, from seeping around the first substrate 11 and around the second substrate 19. Specifically, should there be no core material 26, the amount of the resin component and the contact area with the first substrate 11 or the second substrate 19 become excessive. Moreover, the resin component tends to seep out as a result of the first and second substrates 11, 19 being pressured together. In addition, if the first substrate 11, spacer 25 and the second substrate 19, superposed one on others, are compressed, it is possible to prevent a spacing 30, delimited by the first substrate 11, second substrate 19 and the spacer 25 from becoming a tightly sealed spacing, that is vacuum spacing, because the through-hole 22 is formed in the second substrate 19. That is, if there is no through-hole 22 in the second substrate 19 such that the spacing 30 is in a vacuum state, the first substrate 11 and the second substrate 19 are attracted to the vacuum spacing 30 and thereby deformed. The through-hole 22 connects the spacing 30 to outside to equilibrate the pneumatic pressure in the outside to that in the spacing 30 to prevent the first substrate 11 and the second substrate 19 from being deformed.

Figure 10:
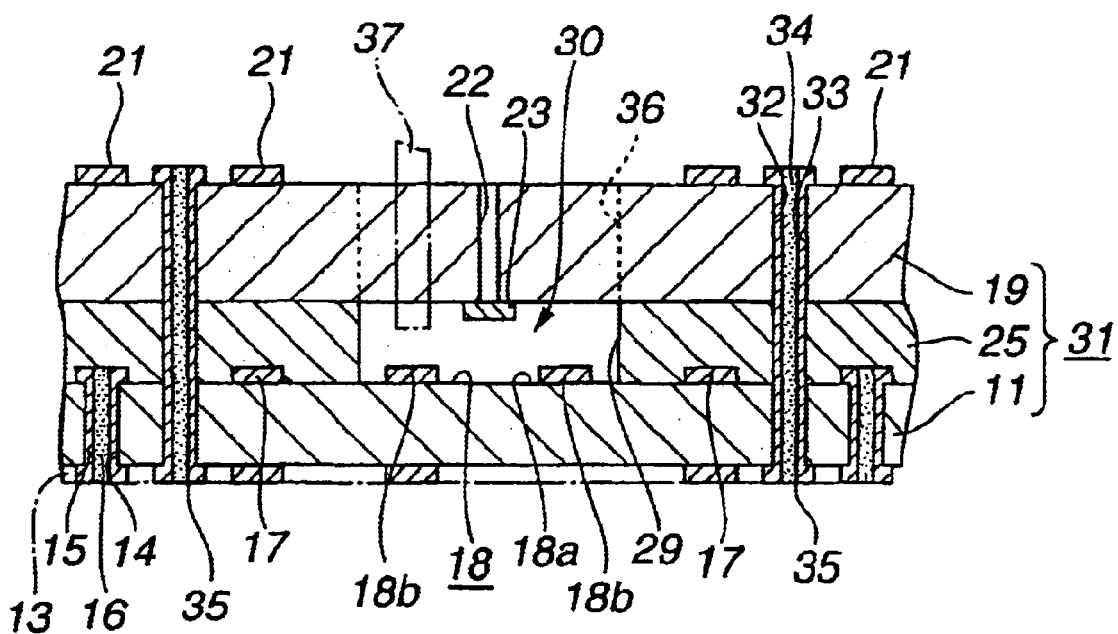
FIG. 10 is a cross-sectional view of the substrate showing a second opening being formed in the substrate.

Then, a via-hole 32 for establishing electrical connection between the second wiring pattern 21 formed on the second substrate 19 and the second electrically conductive layer 13 formed on the opposite surface of the first substrate 11 is bored through the substrate 31 comprised of the first substrate 11 and the second substrate 19 unified together, with the interposition of the spacer 25, as shown in FIG. 10. For boring the through-hole 22, a drill unit with a drill diameter of 0.3 mm is used. The entire surface of the substrate 31, inclusive of the inner surface of the through-hole 22 formed therein, is copper-plated at 33, to a thickness of 27±5 mm, for establishing electrical connection between the second wiring pattern 21 formed on the second substrate 19 and the second electrically conductive layer 13 formed on the first substrate 11. The via-hole 32, the inner peripheral surface of which is copper-plated at 33, is charged with a synthetic resin mass 34 by way of permanent filling. A dry film then is bonded on the surface of the second electrically conductive layer 13 on the opposite surface of the first substrate 11, exposed to light and etched to form a third wiring pattern 35.

Figure 2:
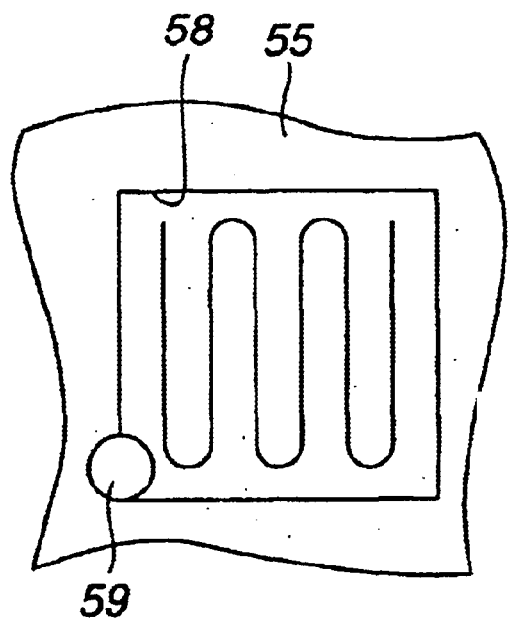
FIG. 2 is a diagrammatic view showing the trajectory of a router in forming an opening used for exposing a component mounting portion for mounting an electronic component to outside.
Figure 3:
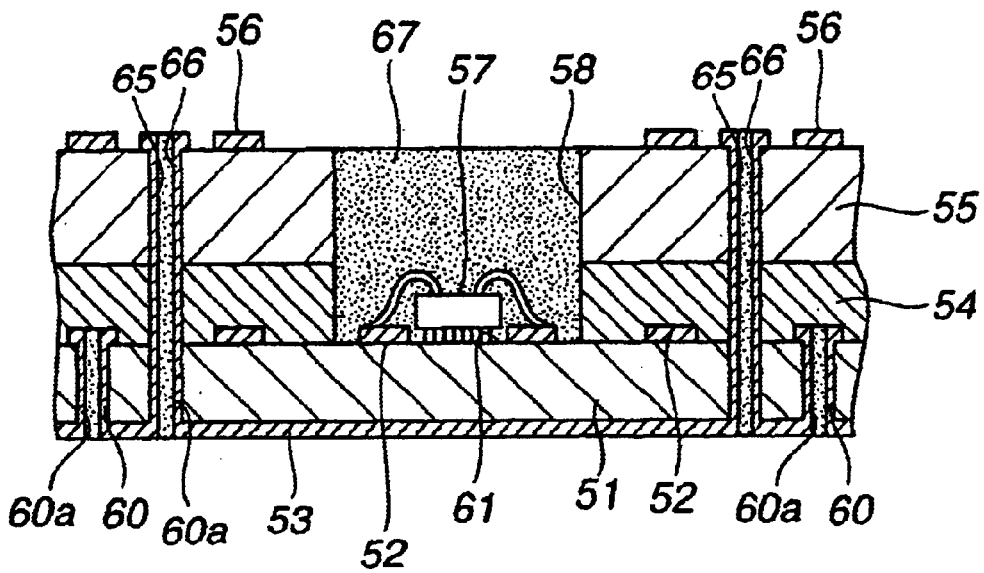
FIG. 3 is a cross-sectional view showing the state in which an electronic component is mounted in the opening and a synthetic resin mass is charged into the opening.
Figure 4:
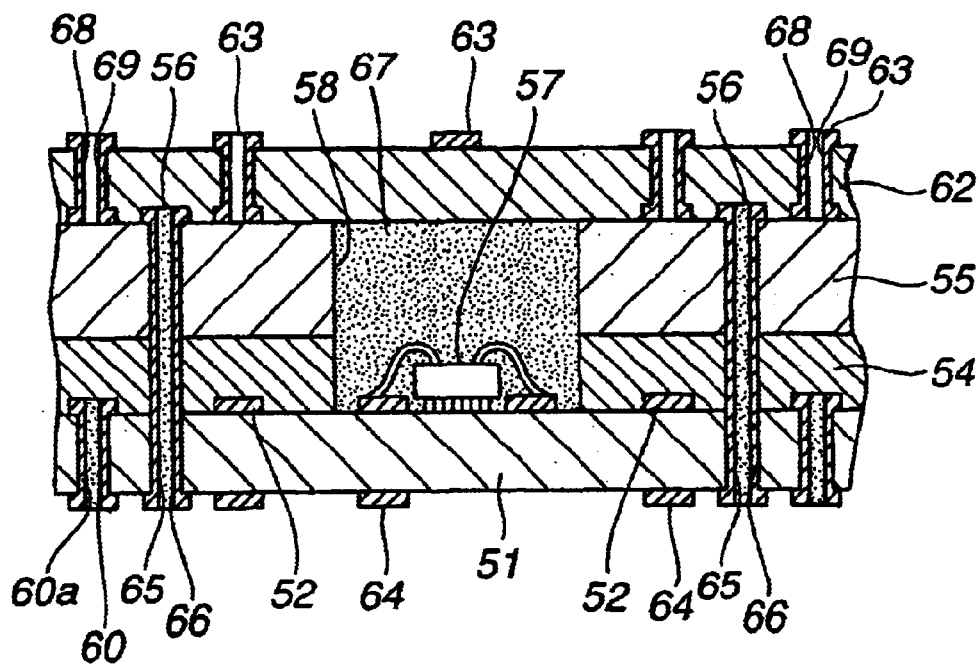
FIG. 4 is a cross-sectional view of a conventional printed wiring board having an electronic component enclosed therein.
Figure 11:
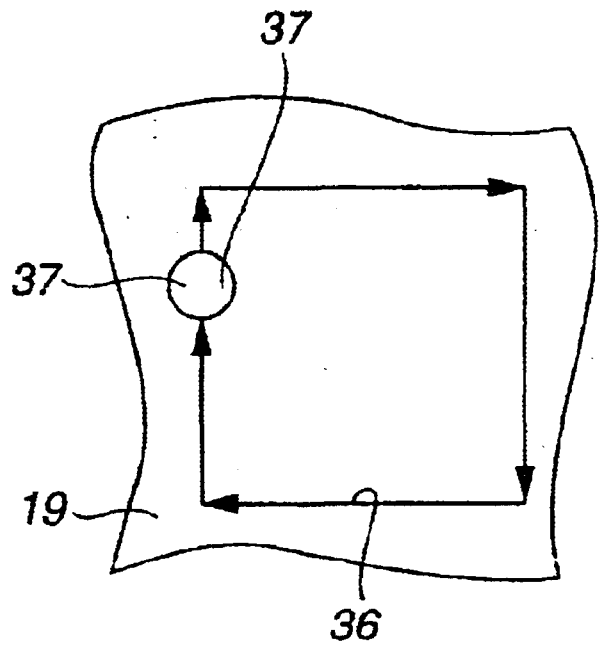
FIG. 11 is a plan view showing the trajectory of a router in forming the second opening in the second substrate.
Figure 12:
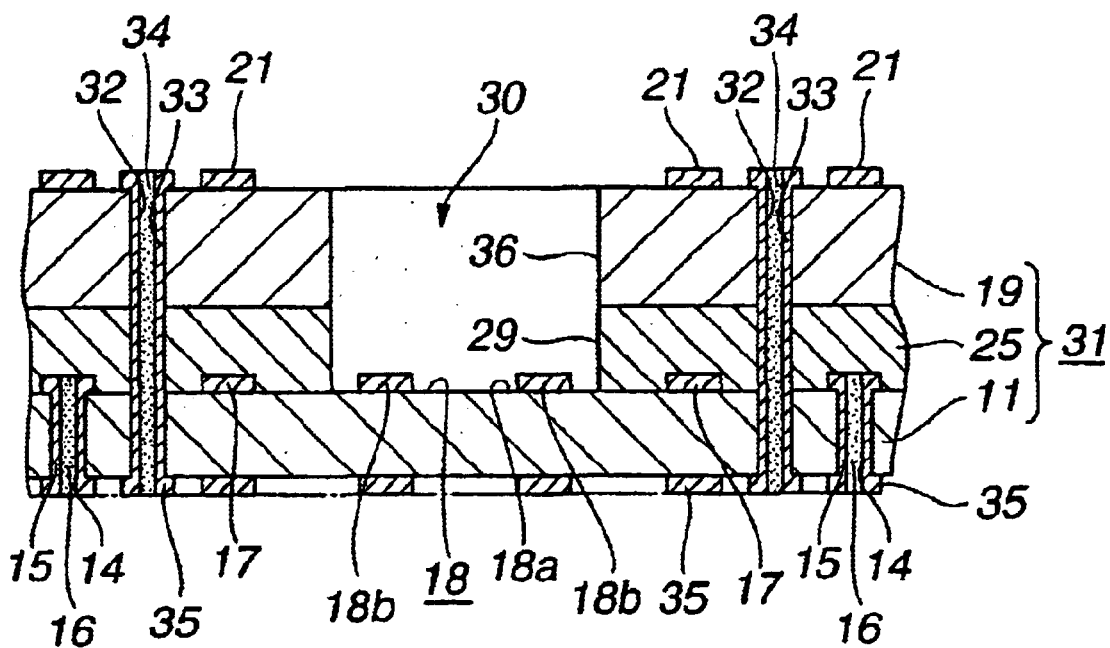
FIG. 12 is a cross-sectional view showing the state in which a second opening has been bored in a substrate.

Then, a second opening 36, for exposing to outside the component mounting portion 18 used for mounting an electronic component of the first substrate 11, is formed in the second substrate 19 making up the substrate 31, as shown in FIGS. 10 and 12. This second opening 36 is bored in continuation to the first opening 29 bored in the spacer 25 for exposing the component mounting portion 18 formed in the first substrate 11 to outside. That is, this second opening 36 is formed to substantially a rectangle, 134×94 mm in size, using a router 37 with a drill diameter of 1.0 mm. Referring to FIG. 11, the router 37 is run to follow the outer rim of the first opening 29. After running through the round of the first opening 29, the second substrate 19 is punched through in substantially a rectangle to form the second opening 36 to expose the component mounting portion 18 of the first substrate 11 to outside. Conventionally, the router 59 is run through a substantially rectangular path and then through a staggered path to form the opening 58, as shown in FIG. 2. In the present embodiment, the router is run along a substantially rectangular path to follow the outer rim of the first opening 29 to cut off a pre-set area of the first opening 29 to form the second opening 36, as shown in FIG. 1, thus shortening the time for forming.

Figure 9:
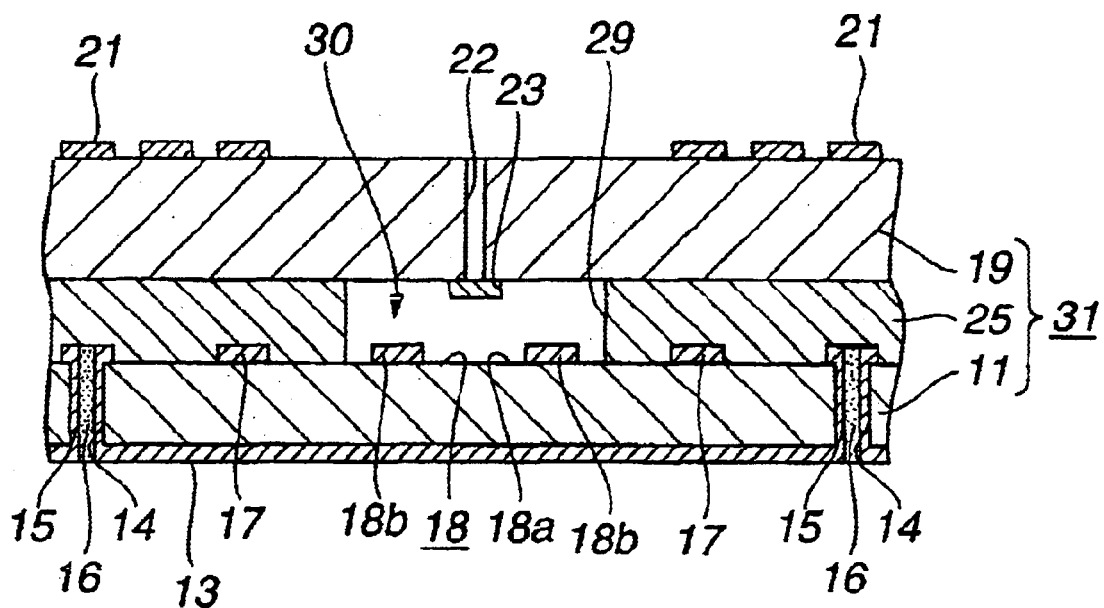
FIG. 9 is a cross-sectional view of a substrate formed by the first substrate becoming unified via the spacer to the second substrate.

It is noted that the spacing 30 shown in FIG. 9 is formed by forming the spacer 25, by superposing the core material 26 and the first and second prepregs 27, 28, 50 that the spacing 30 will have a depth, corresponding to the thickness of the spacer 25, equal to approximately 100 $\mu$m. Although the drill of the router 37 has a tolerance in the up-and-down direction of ±30 $\mu$m, the spacing 30 has a depth approximately equal to 100 $\mu$m to prevent the drill from damaging the component mounting portion 18 of the first substrate 11.

In this manner, the first and second substrates 11, 19 are layered together, and the first to third wiring patterns 17, 21 and 25 are formed, to complete the substrate 31 shown in FIG. 12. The substrate 31 then is subjected to an electrical inspection as to whether or not the first to third wiring patterns 17, 21 and 25 are not electrically shorted. In the manufacturing method for the printed wiring board according to the present invention, since the electrical inspection can be performed prior to mounting the electronic component, in contradistinction from the conventional practice, it is possible to prevent wastage of the electronic component as compared to the conventional practice in which the printed wiring board is electrically checked after mounting the electronic component.

Figure 13:
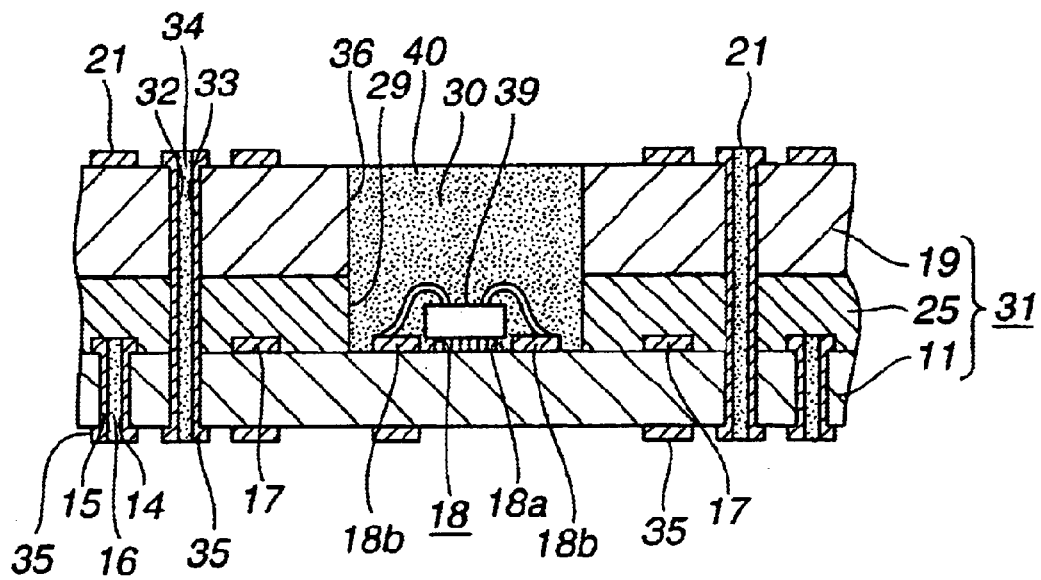
FIG. 13 is a cross-sectional view showing the electronic component mounted in the substrate.

On the component mounting portion 18 of the first substrate 11, exposed to outside through the first opening 29 and through the second opening 36 formed in the second substrate 19, an electronic component 39 is mounted, as shown in FIG. 13. This electronic component 39 is comprised of a package of synthetic resin, having enclosed therein a semiconductor chip carrying thereon a semiconductor circuit of a square shape 6×6 mm in size. The electronic component 39 is coated by a stamp nozzle with an insulating thermosetting adhesive, such as Dye-Bond, an epoxy-based insulating resin. The electronic component 39 is then baked at 150° C. for 30 minutes and secured to a mounting portion 18a of the component mounting portion 18. The inside of the spacing 30, within which is mounted the electronic component 39, is subjected to plasma-cleaning, and the electronic component 39 is then electrically connected to the land portion 18a by wire bonding. Into the spacing 30, in which the wiring of the electronic component 39 is finished, a synthetic resin mass 40 is charged by potting and sealed. The surface of the synthetic resin mass 40 then is coated.

Figure 14:
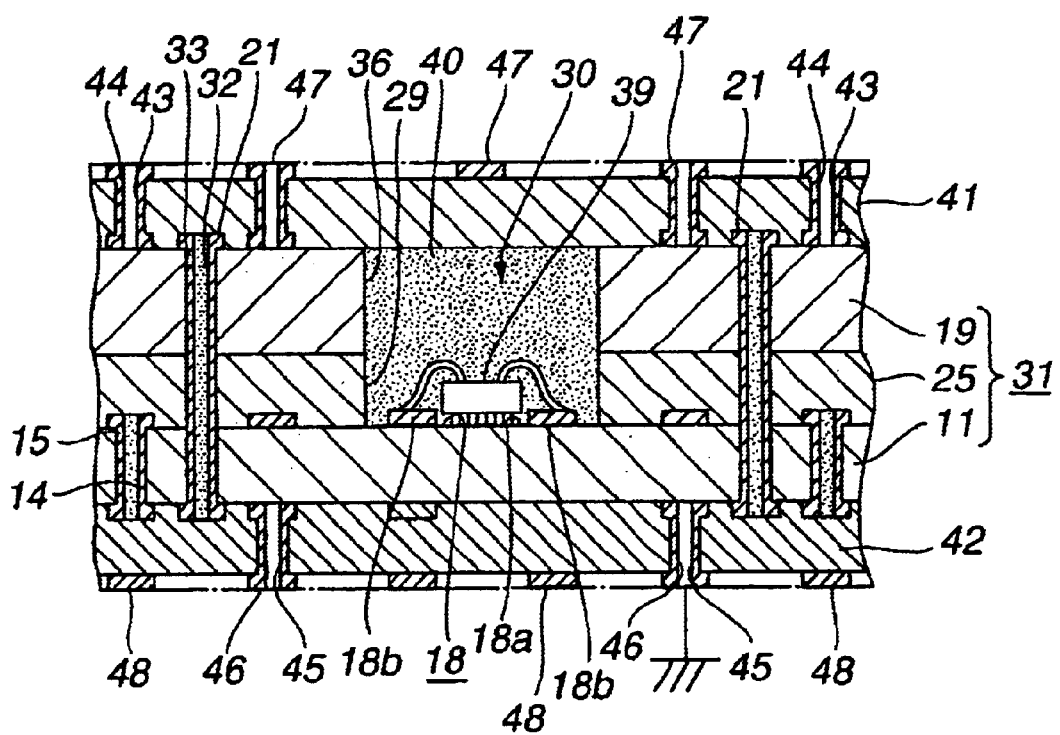
FIG. 14 is a cross-sectional view showing a printed wiring board produced by the manufacturing method according to the present invention.

The surface of the second substrate 19, carrying the second wiring pattern 21, and the opposite side surface of the first substrate 11, carrying the third wiring pattern 35, then are blacked for roughing, using a treatment solution, for improving adhesion to a third substrate 41 and to a fourth substrate 42, now to be formed. The surface of the second substrate 19, carrying the second wiring pattern 21, and the opposite side surface of the first substrate 11, carrying the third wiring pattern 35, then are subjected to RCC (resin coated copper foil) molding, as shown in FIG. 14, to form a copper foil, 18 $\mu$m in thickness, thereon, to form the third substrate 41 and the fourth substrate 42 each having a substrate thickness of 0.08 mm. That is, the third substrate 41 and the fourth substrate 42 are formed on the surface of the second substrate 19, carrying the second wiring pattern 21, and the opposite side surface of the first substrate 11, carrying the third wiring pattern 35, by vacuum heating and pressuring the resin-coated copper foil. The substrate 31 is grounded at this time to prevent the electronic component 39 from being damaged by static electricity. The substrate 31 is then heated and pressured. Specifically, the substrate 31 is heated at 110° C. for 60 minutes and then pressured for 40 minutes at 20 kg/cm$^2$. Meanwhile, the pressuring is carried out under a pressure not higher than 40 kg/cm$^2$ in order to prevent the electronic component 39 enclosed in the substrate 31 from being destroyed under pressure.

The entire surfaces of the copper foils on the third substrate 41 and the fourth substrate 42 are soft-etched. A via-hole 43 for establishing electrical connection to the second wiring pattern 21 is bored by laser light through the third substrate 41. After boring the via-hole 43 by the laser light, resin residues in the via-hole 43 are chemically decomposed and removed, by way of besmearing, using a solution of potassium permanaganate. The inner surface of the via-hole 43 then is plated with copper at 44 to provide for electrical connection with the second wiring pattern 21. A via-hole 45 for establishing electrical connection to the first wiring pattern 17 then is bored in the fourth substrate 42. After boring the via-hole 43 by the laser light, resin residues in the via-hole 45 are chemically decomposed and removed, by way of besmearing, using a solution of potassium permanaganate. The inner surface of the via-hole 45 then is plated with copper at 46 to provide for electrical connection with the second wiring pattern 21. A dry film then is bonded on the third substrate 41 and the fourth substrate 42, exposed to light, developed and etched to form a fourth wiring pattern 47 and a fifth wiring pattern 48. In a surface area of the third substrate 41, carrying the fourth wiring pattern 47, and in a surface area of the fourth substrate 42, carrying the fifth wiring pattern 48, other than the soldering areas thereof left for mounting further electronic components thereon, there are formed protective films. Specifically these protective films are formed by coating an ink on the surface areas, followed by drying, exposure to light, development and curing. The protective films may also be formed by screen printing. The printed wiring board is completed by trimming.

The entire surfaces of the copper foils on the third substrate 41 and the fourth substrate 42 are soft-etched. A via-hole 43 for establishing electrical connection to the second wiring pattern 21 is bored by laser light through the third substrate 41. After boring the via-hole 43 by the laser light, resin residues in the via-hole 43 are chemically decomposed and removed, by way of besmearing, using a solution of potassium permanaganate. The inner surface of the via-hole 43 then is plated with copper at 44 to provide for electrical connection with the second wiring pattern 21. A via-hole 45 for establishing electrical connection to the first wiring pattern 17 then is bored in the fourth substrate 42. After boring the via-hole 45 by the laser light, resin residues in the via-hole 45 are chemically decomposed and removed, by way/of besmearing, using a solution of potassium permanaganate. The inner surface of the via-hole 45 then is plated with copper at 46 to provide for electrical connection with the third wiring pattern 35. A dry film then is bonded on the third substrate 41 and the fourth substrate 42, exposed to light, developed and etched to form a fourth wiring pattern 47 and a fifth wiring pattern 48. In a surface area of the third substrate 41, carrying the fourth wiring pattern 47, and in a surface area of the fourth substrate 42, carrying the fifth wiring pattern 48, other than the soldering areas thereof left for mounting further electronic components thereon, there are formed protective films. Specifically these protective films are formed by coating an ink on the surface areas, followed by drying, exposure to light, development and curing. The protective films may also be formed by screen printing. The printed wiring board is completed by trimming.

What is claimed is:

1. A method for producing a printed wiring board comprising the steps of:

forming a wiring pattern on one surface of a first substrate and forming a component mounting portion for mounting an electronic component thereon;

forming an insulating spacer having a first opening formed in registration with the component mounting portion of said first substrate;

forming a second substrate;

stacking said spacer on said one surface of said first substrate, with said first opening in registration with said component mounting portion, stacking said second substrate on said spacer, pressing together the first substrate, spacer and the second substrate, thus stacked, for bonding;

boring a second opening in said second substrate, after bonding said first substrate, spacer and the second substrate together, in registration with said first opening, so that said second opening is in continuation to said first opening, for exposing the component mounting portion of said first substrate to outside;

mounting an electronic component on said component mounting portion of said first substrate which makes up the bottom of a spacing delimited by said first and second openings, continuing to each other, and filling resin in said spacing, having said electronic component mounted therein; and providing a third substrate on said second substrate to stop said spacing after charging resin in said spacing.

2. The method for producing a printed wiring board according to claim 1 wherein said spacer includes a core material, a first prepreg provided between said core material and said first substrate, and a second prepreg provided between said core material and the second substrate.

3. The method for producing a printed wiring board according to claim 1 wherein in the step of forming said second substrate, a through-hole is formed in said second substrate so that, when said second substrate is superposed on said first substrate, and through-hole overlies said first opening.

4. The method for producing a printed wiring board according to claim 1 wherein after bonding said first substrate, said spacer and the second substrate, a further wiring pattern is formed on the other surface of said first substrate and wherein said second opening is then formed in said second substrate.

5. The method for producing a printed wiring board according to claim 4 wherein after forming said second opening in said second substrate, a substrate assembly made up of the first substrate, spacer and the second substrate, bonded together, is inspected electrically, said electronic component being then mounted on said component mounting portion.

6. The method for producing a printed wiring board according to claim 1 wherein when pressing said first substrate, spacer and the second substrate together, the first substrate, spacer and the second substrate, stacked together, are heated and pressured at a temperature lower than glass transition temperature of the first substrate, spacer and the second substrate.

7. The method for producing a printed wiring board according to claim 1 wherein when said third substrate is provided on said second substrate, the first substrate, spacer and the second substrate, bonded together, are grounded.

8. The method for producing a printed wiring board according to claim 1 wherein said step of forming a wiring pattern on one surface of a first substrate includes the formation of a land portion for wire bonding.

9. The method for producing a printed wiring board according to claim 8 wherein a mounting portion is formed along with the land portion on said first substrate.

* * * * *

UNITED STATES PATENT AND TRADEMARK OFFICE
CERTIFICATE OF CORRECTION

PATENT NO. : 6,625,880 B2
DATED : September 30, 2003
INVENTOR(S) : Yoshie Nabemoto It is certified that error appears in the above-identified patent and that said Letters Patent is hereby corrected as shown below:

<u>Title page,</u>
Item [30], Foreign Application Priority Data, should read -- Mar. 3, 2000     (JP) ............................P2000-063383 --.

Signed and Sealed this

Twenty-first Day of December, 2004

JON W. DUDAS
*Director of the United States Patent and Trademark Office*